United States Patent
Peng et al.

(10) Patent No.: US 8,098,633 B2
(45) Date of Patent: Jan. 17, 2012

(54) DEVICE AND METHOD FOR BIT-INTERWEAVING

(75) Inventors: Focai Peng, Shenzhen (CN); Cuihong Han, Shenzhen (CN)

(73) Assignee: ZTE Corporation (CN)

( * ) Notice: Subject to any disclaimer, the term of this patent is extended or adjusted under 35 U.S.C. 154(b) by 455 days.

(21) Appl. No.: 12/521,833

(22) PCT Filed: May 17, 2007

(86) PCT No.: PCT/CN2007/001615
§ 371 (c)(1),
(2), (4) Date: Jun. 30, 2009

(87) PCT Pub. No.: WO2008/086669
PCT Pub. Date: Jul. 24, 2008

(65) Prior Publication Data
US 2010/0103907 A1    Apr. 29, 2010

(30) Foreign Application Priority Data
Jan. 8, 2007  (CN) .......................... 2007 1 0000319

(51) Int. Cl.
*H04B 7/216* (2006.01)
(52) U.S. Cl. ...................................... 370/335
(58) Field of Classification Search .................. 370/335; 375/261
See application file for complete search history.

(56) References Cited

U.S. PATENT DOCUMENTS

| | | | | |
|---|---|---|---|---|
| 2002/0141367 | A1* | 10/2002 | Hwang et al. | 370/335 |
| 2003/0072292 | A1* | 4/2003 | Yoon et al. | 370/342 |
| 2005/0204251 | A1* | 9/2005 | Moon et al. | 714/748 |
| 2008/0159537 | A1* | 7/2008 | Khan et al. | 380/268 |
| 2009/0257454 | A1* | 10/2009 | Maltsev et al. | 370/480 |
| 2010/0091910 | A1* | 4/2010 | Mukai et al. | 375/340 |
| 2010/0290561 | A1* | 11/2010 | Ko et al. | 375/298 |
| 2010/0290564 | A1* | 11/2010 | Yoshimoto | 375/316 |

FOREIGN PATENT DOCUMENTS

| | | |
|---|---|---|
| EP | 1511212 | 3/2005 |
| WO | WO-2006018678 | 2/2006 |
| WO | WO-2006083233 | 8/2006 |

OTHER PUBLICATIONS

3GPP, Proposed WID for 64QAM for HSDPA Part 16, 3GPP TSG-RAN #34 RP-060846, Nov. 28-Dec. 1, 2006, pp. 1-4.*
Extended European Search Report Dated Dec. 1, 2010, Applicant ZTE Corporation, Application No. 07721188.6-2223 / 2120346 PCT/CN/2007001615—2 Pages.
3rd Generation Partnership Project; Technical Specification Group Radio Access Network; Multiplexing and channel coding (FDD) (Release 7), 3GPP TS 25.212 V7.3.0 (Dec. 2006), XP008111019, 84 Pages.
Ericsson, 64QAM for HSDPA—Performance Summary, TSG-RAN WG1 Meeting #47, Riga, Latvia, Nov. 6-10, 2006, R1-063501, 1 Page.

(Continued)

*Primary Examiner* — Kenny Lin
*Assistant Examiner* — Faisal Choudhury
(74) *Attorney, Agent, or Firm* — Brooks Kushman P.C.

(57) ABSTRACT

To support the higher modulation (such as 64QAM) in HSPA+ downlink data channel while fully be compatible with the existing HSDPA system, a device and method for bit interleaving are disclosed to process bit interleaving of a HS-PDSCH channel in HSPA+ of the WCDMA system.

11 Claims, 9 Drawing Sheets

OTHER PUBLICATIONS

Mitsubishi Electric, Proposal of interleave structure of HSDPA, 3GPP TSG RAN WG1 #22, Jeju, Korea, Nov. 19-23, 2001, Tdoc R-1-01-1143, 5 Pages.

3GPP TS 25.212 V7.3.0, 3rd Generation Partnership Project; Technical Specification Group Radio Access Network; Multiplexing and channel coding (FDD). (Release 7). Dec. 2008, pp. 53-59.

* cited by examiner

FIG. 7 the order of bit before interleaving is as follows:

| 1 | 2 | 3 | ... | ... | 28 | 29 | 30 |
|---|---|---|---|---|---|---|---|
| 31 | 32 | 33 | ... | ... | 58 | 59 | 60 |
| 61 | 62 | 63 | ... | ... | 88 | 89 | 90 |
| ... | ... | ... | ... | ... | ... | ... | ... |
| ... | ... | ... | ... | ... | ... | ... | ... |
| 871 | 872 | 873 | ... | ... | 898 | 899 | 900 |
| 901 | 902 | 903 | ... | ... | 928 | 929 | 930 |
| 931 | 932 | 933 | ... | ... | 958 | 959 | 960 | the order of bit after interleaving is as follows:

| 1 | 21 | 11 | ... | ... | 23 | 28 | 18 |
|---|---|---|---|---|---|---|---|
| 31 | 51 | 41 | ... | ... | 53 | 58 | 48 |
| 61 | 81 | 71 | ... | ... | 83 | 88 | 78 |
| ... | ... | ... | ... | ... | ... | ... | ... |
| ... | ... | ... | ... | ... | ... | ... | ... |
| 871 | 891 | 881 | ... | ... | 893 | 898 | 888 |
| 901 | 921 | 911 | ... | ... | 923 | 928 | 918 |
| 931 | 951 | 941 | ... | ... | 953 | 958 | 948 |

DEVICE AND METHOD FOR BIT-INTERWEAVING

CROSS REFERENCE TO RELATED APPLICATIONS

The present application is the U.S. National Phase of International Patent Application Serial No. PCT/CN2007/001615, filed May 17, 2008, which claims the benefit of Chinese Patent Application Serial No. 200710000319.4, filed Jan. 8, 2007, both of which are hereby incorporated by reference in their entireties.

TECHNICAL FIELD

The present invention relates to a method for bit interleaving in a wideband code division multiple access (WCDMA) mobile communication system, and more particularly to a device and method for bit interleaving of the high speed downlink share channel (HS-DSCH) in high speed packet access evolution (HSPA+).

TECHNICAL BACKGROUND

According to the proposal RP-060846 (which is a proposed WID for 64QAM for high speed downlink package access (HSDPA)) of the $3^{rd}$ generation partnership project (3GPP), a new higher order modulation scheme, such as 64 quadrature amplitude modulation (64QAM), will be added in the HSPA+ downlink. However, the current 3GPP Specs have not defined how to add 64QAM into the new Specs.

Figure 1:
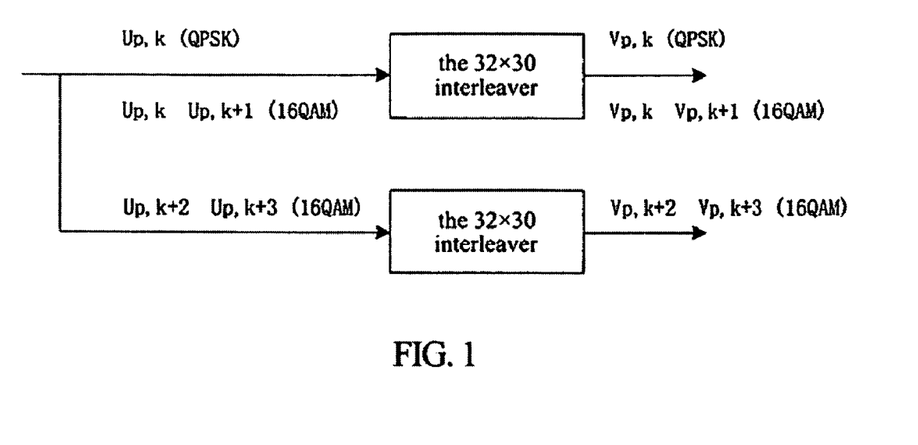
FIG. 1 is a diagram of bit interleaving for QPSK and 16QAM in prior art.

According to the section 4.5.6 in 3GPP TS 25.212 V7.3.0, a physical layer channel coding module of a base station (referred to as Node B hereinafter) needs to interleave the data come from the physical channel segment part. However, the current bit interleaving module supports only quadrature phase shift keying modulation (QPSK) and 16 quadrature amplitude modulation (16QAM). A method for bit interleaving for QPSK and 16QAM in prior art is provided in FIG. 1.

In order to completely support 64QAM technology in the HSPA+ system and be compatible with existing HSDPA technology, there is a need for a new method for bit interleaving. The HSPA+ system can support well higher order modulation technology such as 64QAM and be fully compatible with the existing system using the method.

SUMMARY OF THE INVENTION

A technical problem to be solved by this invention is to provide a device and method for bit interleaving such that a high speed packet access evolution system can support well higher order modulation technology such as 64 quadrature amplitude modulation and be fully compatible with the existing system.

In order to solve the technology problem described above, this invention discloses a method for bit interleaving used for processing bit interleaving of the high speed downlink share channel in high speed packet access evolution of the wideband code division multiple access mobile communication system, and the method comprises first reading high layer control information containing a modulation scheme and number of codes, and a procedure of bit interleaving for each code comprises the following steps:

(a) determining the number $N_{Int}$ of rectangular interleavers required to be used according to the modulation scheme;

(b) determining the number of bits U of a single code according to system parameters;

(c) writing respectively row by row the U data after segmenting a physical channel into $N_{Int}$ $N_{row} \times N_{col}$ interleavers;

(d) interleaving the data in the $N_{Int}$ $N_{row} \times N_{col}$ interleavers in a manner of block interleaving;

(e) reading bits of the single code in turn from the $N_{Int}$ interleavers, wherein the data in each interleaver is read column by column and;

(f) combining orderly the data read from the $N_{Int}$ interleavers in each turn into U bits.

Further, the method described above may also have the following features. In the step (a), the number of the rectangular interleavers is $$N_{Int} = \frac{BitPerSymbol}{2} = \frac{1}{2} \cdot \log_2(ModulationOrder),$$

where BitPerSymbol is the number of bits in each symbol, and ModulationOrder is an order of modulation. When the modulation scheme is quadrature phase shift keying modulation, the order of modulation is 4; when the modulation scheme is 16 quadrature amplitude modulation, the order of modulation is 16; when the modulation scheme is 64 quadrature amplitude modulation, the order of modulation is 64; when the modulation scheme is 256 quadrature amplitude modulation, the order of modulation is 256; when the modulation scheme is 1024 quadrature amplitude modulation, the order of modulation is 1024; and when the modulation scheme is 4096 quadrature amplitude modulation, the order of modulation is 4096.

Further, the method described above may also have the following features. In the step (b), the number of bits of the single code is $$U = \frac{ChipRate}{SF} \cdot TTI \cdot BitPerSymbol,$$

where ChipRate is a chip rate of the wideband code division multiple access frequency division duplex system, SF is a spread spectrum factor of high speed downlink package access, and TTI is a transmission time interval of the high speed downlink package access.

Further, the method described above may also have the following features: when the modulation scheme is 64 quadrature amplitude modulation, the number of the rectangular interleavers is $N_{Int}=3$, each interleaver being a 32×30 interleaver, and the number of bits of the single code is U=2880.

Further, the method described above may also have the following features. In the step (c), writing orderly the U bits into the $N_{Int}$ $N_{row} \times N_{col}$ rectangular interleavers if the modulation scheme is quadrature phase shift keying modulation;

writing the $(k+(m-1)\cdot 2)^{th}$ bit and the $(k+1+(m-1)\cdot 2)^{th}$ bit of the U bits into the $m^{th}$ interleaver if the modulation scheme is 16 quadrature amplitude modulation;

writing orderly the U bits into the $N_{Int}$ $N_{row} \times N_{col}$ rectangular interleavers in one of the following four ways if the modulation scheme is 64 quadrature amplitude modulation or higher order quadrature amplitude modulation:

1) writing the $(k+(m-1)\cdot 2)^{th}$ bit and the $(k+1+(m-1)\cdot 2)^{th}$ bit of the U bits into the $m^{th}$ interleaver;

2) writing the $(k+(m-1)\cdot 2)^{th}$ bit and the $(k+1+(m-1)\cdot 2)^{th}$ bit of the U bits into the $(N_{Int}-m+1)^{th}$ interleaver;

3) writing the $(k+m-1)^{th}$ bit and the $(k+m-1+N_{Int})^{th}$ bit of the U bits into the $m^{th}$ interleaver;

4) writing the $(k+m-1)^{th}$ bit and the $(k+m-1+N_{Int})^{th}$ bit of the U bits into the $(N_{Int}-m+1)^{th}$ interleaver;

where a value of k is computed as the follows: $k=1+(n-1)\cdot$BitPerSymbol, $N_{row}\times N_{col}$ is a row number or a column number of the interleavers specified in the high speed downlink packer access, n is a positive integer between 1 and $$\frac{N_{row}\times N_{col}}{2}, \text{ i.e., } n \in \left\{1, 2, 3, \ldots \frac{N_{row}\times N_{col}}{2}\right\},$$

and m is the number for the interleaver and is a positive integer between 1 and $N_{Int}$, including 1 and $N_{Int}$.

Moreover, in various cases described above, for each interleaver, the bits are written column by column from the first column to the last column in each row and from the first row to the last row.

Further, the method described above may also have the following features. In the step (e), reading the bits of the single code from the $N_{Int}$ interleavers is performed in multiple turns, wherein 2 bits are read from each interleaver orderly in each turn from the first interleaver to the $N_{Int}$-$^{th}$ interleaver until all the data is read, and the bits for each interleaver are read row by row from the first row to the last row for each column and from the first column to the last column and, in the step (f), combining orderly $2\cdot N_{Int}$ bits read in each turn into the U bits.

A device for bit interleaving provided by the present invention is used for processing bit interleaving of the high speed downlink share channel in high speed packet access evolution of a wideband code division multiple access mobile communication system, and the device comprises a module for reading information from the high layer, a module for calculating the number of interleavers, a module for calculating the number of bits in a code, a module for reading data, a module for assigning bits, a module for writing bits for interleaving, a module for interleaving bits, a module for reading interleaved bits, a module for combining bits, wherein the module for reading information from the high layer is used for reading control information containing the modulation scheme and the code number from the high layer and outputting the control information to a module which uses the modulation scheme and the code number.

The module for calculating the number of interleavers is used for calculating the number $N_{Int}$ of rectangular interleavers required by a single code according to the modulation scheme and outputting the number $N_{Int}$ to those modules which need the number $N_{Int}$.

The module for calculating the number of bits in a code is used for calculating the bits number U of a single code according to system parameters and outputting the bits number U to those modules which need the bits number U.

The module for reading data is used for reading data after physical channel segmentation and outputting the data to the module for assigning bits.

The module for assigning bits is used for assigning the inputted U bits into the $N_{Int} N_{row}\times N_{col}$ interleavers according to the modulation scheme.

The module for writing bits for interleaving is used for writing respectively in row the data obtained from the module for reading data into the corresponding interleavers.

The module for interleaving bits is used for interleaving the bits written into the interleavers in a manner of block interleaving.

The module for reading interleaved bits is used for reading the bits of a single code in turn from $N_{Int} N_{row}\times N_{col}$ rectangular interleavers, wherein the data in each interleaver are read in column and, The module for combining bits is used for combining orderly the data read from the $N_{Int}$ interleavers into the U bits.

The modules described above complete the processing for one code at a time.

Further, the device described above may also have the following features. The module for calculating the number of interleavers calculates the number $N_{Int}$ of the rectangular interleavers in the following manner:

$$N_{Int} = \frac{BitPerSymbol}{2} = \frac{1}{2}\cdot \log_2(ModulationOrder),$$

where BitPerSymbol is the number of bits in a symbol, and ModulationOrder is an order of modulation. When the modulation scheme is quadrature phase shift keying modulation, the order of modulation is 4; when the modulation scheme is 16 quadrature amplitude modulation, the order of modulation is 16; when the modulation scheme is 64 quadrature amplitude modulation, the order of modulation is 64; when the modulation scheme is 256 quadrature amplitude modulation, the order of modulation is 256; when the modulation scheme is 1024 quadrature amplitude modulation, the order of modulation is 1024; and when the modulation scheme is 4096 quadrature amplitude modulation, the order of modulation is 4096.

Further, the device described above may also have the following features. The module for calculating the number of bit in a code calculates the number of bits U of the single code in the following manner.

$$U = \frac{ChipRate}{SF}\cdot TTI \cdot BitPerSymbol,$$

where ChipRate is a chip rate of a wideband code division multiple access frequency division duplex system, SF is a spread spectrum factor of high speed downlink package access, and TTI is a transmission time interval of the high speed downlink package access.

Further, the device described above may also have the following features. when the modulation scheme is 64 quadrature amplitude modulation, the number of the rectangular interleavers calculated by the module for calculating the number of interleavers is $N_{Int}=3$, the number of bits of the single code calculated by the module for calculating the number of bits in a code is U=2880, and the module for assigning bits and the module for writing bits for interleaving use 3 32×30 interleavers to process the data.

Further, the device described above may also have the following features. the module for assigning bits and the module for writing bits for interleaving accomplish assignment and writing of the bits in the following manners:

Writing orderly the U bits into the $N_{Int} N_{row}\times N_{col}$ rectangular interleavers if the modulation scheme is quadrature phase shift keying modulation;

Writing the $(k+(m-1)\cdot 2)^{th}$ bit and the $(k+1+(m-1)\cdot 2)^{th}$ bit of the U bits into the $m^{th}$ interleaver if the modulation scheme is 16 quadrature amplitude modulation; and, Writing orderly the U bits into the $N_{Int} N_{row}\times N_{col}$ rectangular interleavers in one of the following four ways if the modulation scheme is 64 quadrature amplitude modulation or higher order quadrature amplitude modulation:

1) writing the $(k+(m-1)\cdot 2)^{th}$ bit and the $(k+1+(m-1)\cdot 2)^{th}$ bit of the U bits into the $m^{th}$ interleaver;

2) writing the $(k+(m-1)\cdot 2)^{th}$ bit and the $(k+1+(m-1)\cdot 2)^{th}$ bit of the U bits into the $(N_{Int}-m+1)^{th}$ interleaver;

3) writing the $(k+m-1)^{th}$ bit and the $(k+m-1+N_{Int})^{th}$ bit of the U bits into the $m^{th}$ interleaver and, 4) writing the $(k+m-1)^{th}$ bit and the $(k+m-1+N_{Int})^{th}$ bit of the U bits into the $(N_{Int}-m+1)^{th}$ interleaver;

where a value of k is as follows: $k=1+(n-1)\cdot \text{BitPerSymbol}$, $N_{row}\times N_{col}$ is a row number or a column number of the interleavers specified in the high speed downlink packer access, n is a positive integer between 1 and $$\frac{N_{row}\times N_{col}}{2}, \text{i.e.}, n \in \left\{1, 2, 3, \ldots \frac{N_{row}\times N_{col}}{2}\right\},$$

and m is a number for the interleaver and is a positive integer between 1 and $N_{Int}$, including 1 and $N_{Int}$.

Moreover, in various cases described above, for each interleaver, the bits are written column by column from the first column to the last column in each row and from the first row to the last row.

Further, the device described above may also have the following features. The module for reading interleaved bits reads the bits of the single code from the $N_{Int}$ interleavers in multiple turns, wherein 2 bits are read from each interleaver orderly in each turn from the first interleaver to the $N_{Int}^{th}$ interleaver until all the data is read, and the data for each interleaver is read row by row from the first row to the last row in each column and from the first column to the last column and, The module for combining bits combines orderly $2\cdot N_{Int}$ bits read in each turn into the U bits.

The present invention further provides a method for bit interleaving for 64 quadrature amplitude modulation, and the method is used for bit interleaving of a high speed downlink share channel in high speed packet access evolution of a wideband code division multiple access mobile communication system, comprising reading firstly high layer control information containing a modulation scheme and a code number, wherein a procedure of bit interleaving for each code is as follows.

(a) determining the number of rectangular interleavers required to be used as 3 according to 64 quadrature amplitude modulation scheme.

(b) determining the number of bits of a single code as 2880 according to system parameters.

(c) writing respectively by row 2880 bits after segmenting the physical channel into 3 identical 32×30 interleavers according to 64 quadrature amplitude modulation scheme, wherein the data is written according to the following rules.

writing the $(k+(m-1)\cdot 2)^{th}$ bit and the $(k+1+(m-1)\cdot 2)^{th}$ bit of the 2880 bits into the $m^{th}$ interleaver, where a value for m is 1, 2 or 3, that is, when m=1, for the first interleaver, the $k^{th}$ bit and the $(k+1)^{th}$ bit are written.

when m=2, for the second interleaver, the $(k+2)^{th}$ bit and the $(k+3)^{th}$ bit are written and, when m=3, for the third interleaver, the $(k+4)^{th}$ bit and the $(k+5)^{th}$ bit are written.

(d) bit interleaving the data in the three 32×30 interleavers in a manner of block interleaving.

(e) reading the bits of the single code from the three interleavers in multiple turns, wherein 2 bits are read from each interleaver orderly from the first interleaver to the second interleaver then to the third interleaver in each turn until all the data is read, and the data for each interleaver is read row by row from the first row to the last row in each column and from the first column to the last column and, (f) combining orderly the data read from the three interleavers in each turn into the 2880 bits.

Thus, it can be observed that the high speed packet access evolution system can support well higher order modulation technology such as 64 quadrature amplitude modulation and be fully compatible with the existing system using the method and device according to the present invention such that the high speed packet access evolution system can obtain higher system throughput than the high speed downlink packet access system and upgrade the existing system. A Node B can provide high system performance on the basis of being fully compatible with the existing system.

PREFERRED EMBODIMENTS OF THE INVENTION

The preferred embodiment according to the technology scheme of the this invention will be further described in detail below in conjunction with the accompany drawings.

Figure 3:
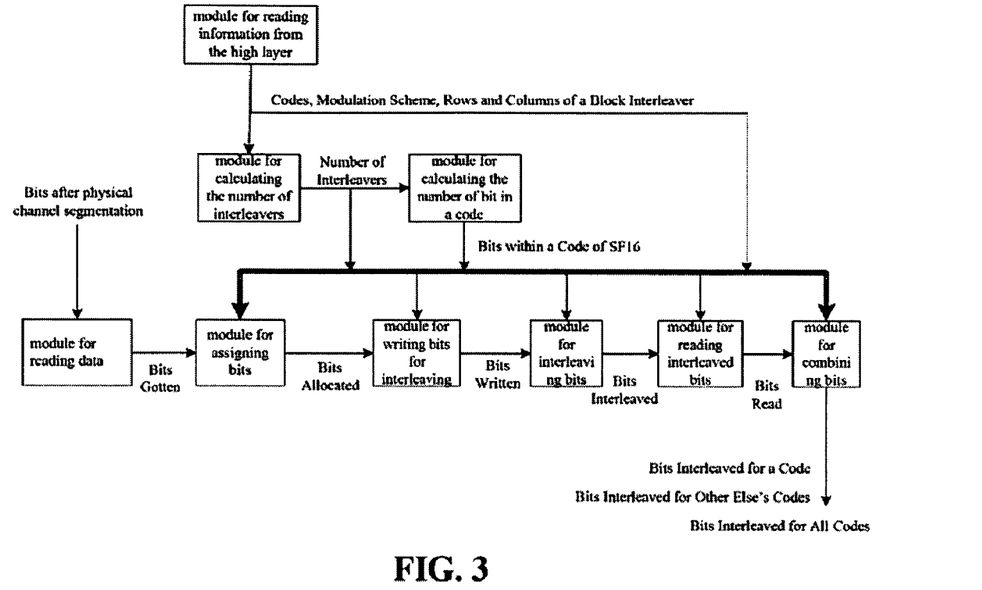
FIG. 3 is a block diagram of the device in accordance with the embodiment of the present invention.
Figure 4:
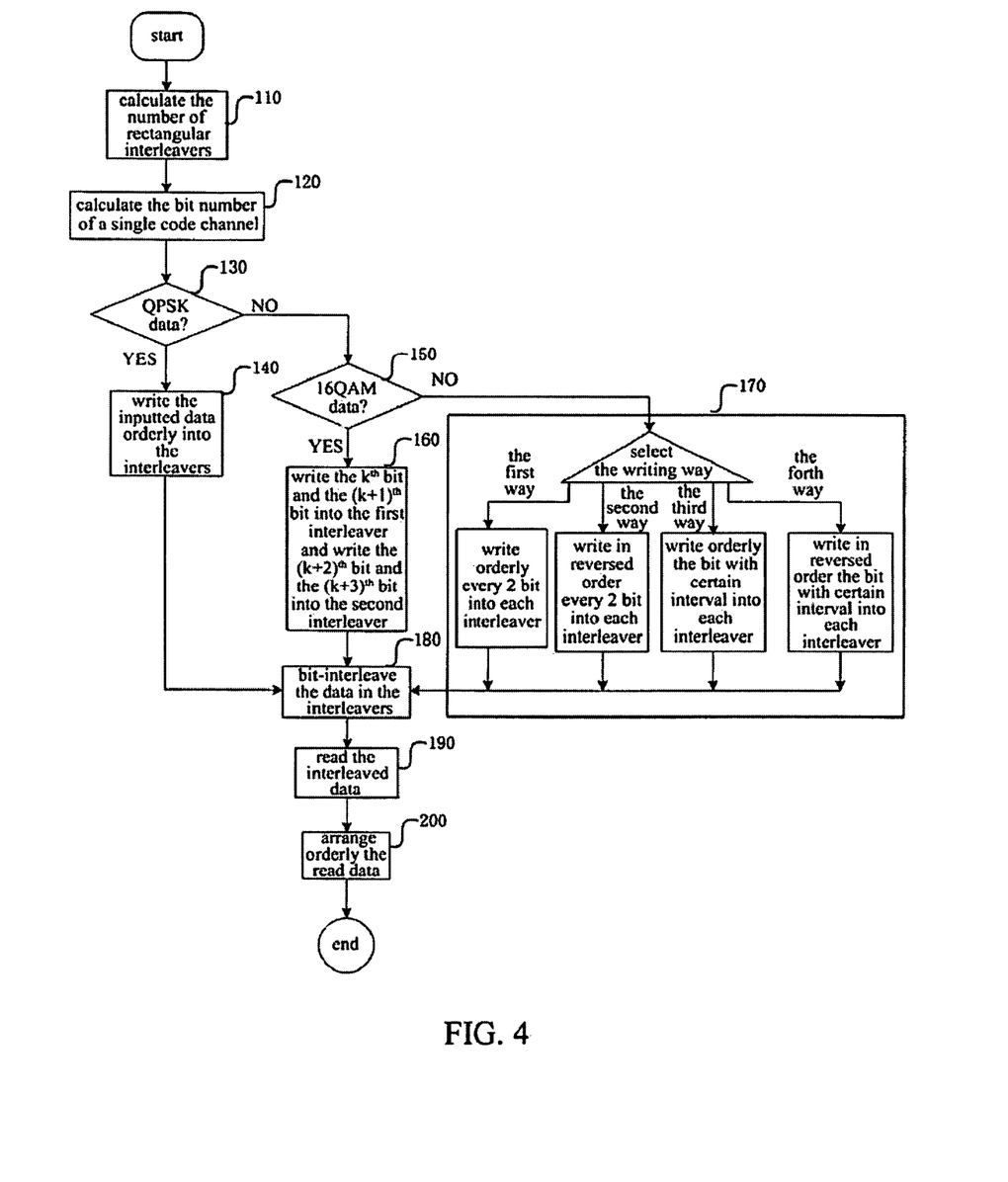
FIG. 4 is a flowchart of the method in accordance with the embodiment of the present invention.
Figure 5:
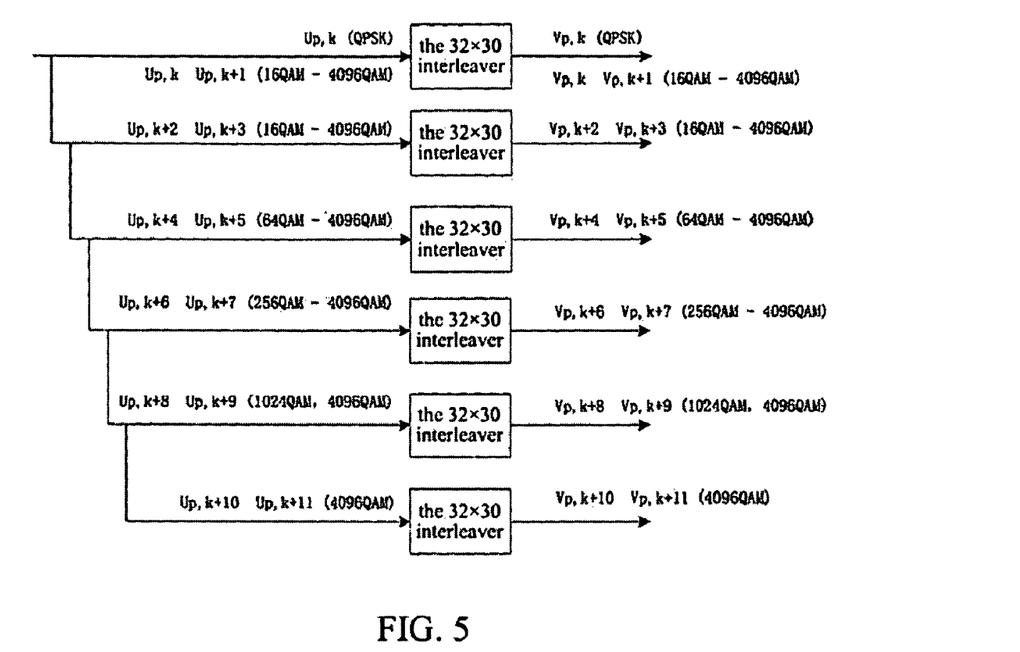
FIG. 5 is a schematic diagram of a method for implementing bit interleaving for various modulation schemes in accordance with the embodiment of the present invention.

A physical layer based on version 3GPP Release 7 (and later release) will use higher order modulation such as 64QAM (may even use 256QAM, 1024QAM, 4096QAM, etc.). However, at present, the 3GPP has not yet determined how to use higher order modulation technology for 64 QAM. Its physical layer specification has not yet eventually been formed. The embodiment provides a device and method for bit interleaving in a HSPA+ system, as shown in FIG. 3, FIG.

Figure 2:
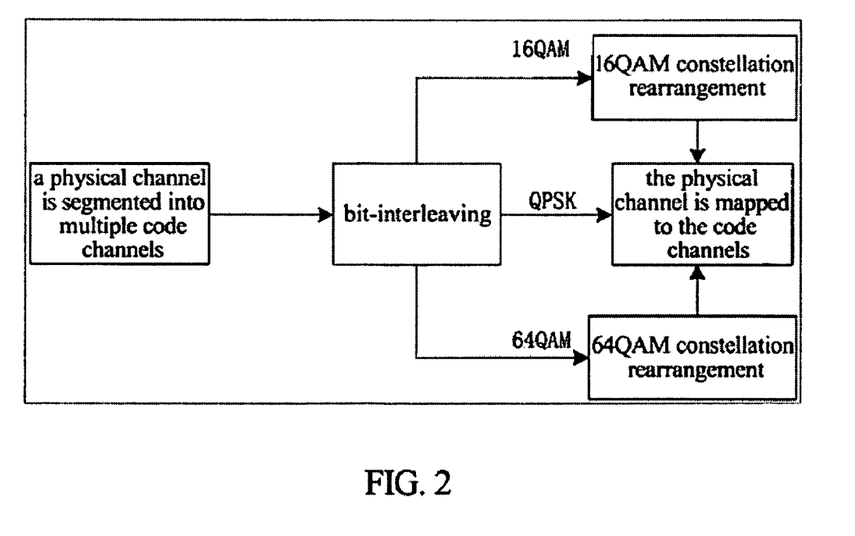
FIG. 2 is a schematic diagram of positions in HSPA+ channel coding in the device and method in accordance with an embodiment of the present invention.

4 and FIG. 5. The device and method for bit interleaving provided by this invention is shown in "bit interleaving" in FIG. 2.

In the method according to the embodiment, the high layer control information containing the modulation scheme and the number of codes is read first. Because the bit interleaving for each code is the same to each other, the procedure of bit interleaving for only one code is described and it is also applicable to other code.

step 110: determining the number $N_{Int}$ of rectangular interleavers according to the modulation scheme as the following formula.

$$N_{Int} = \frac{BitPerSymbol}{2} = \frac{1}{2} \cdot \log_2(ModulationOrder) \quad (1)$$

where BitPerSymbol is the number of bits in each symbol, and the ModulationOrder is the order of modulation, as shown in table 1.

TABLE 1 the number of bits in each symbol and the relationship between the order of modulation and the modulation scheme

| modulation scheme | BitPerSymbol | ModulationOrder |
| --- | --- | --- |
| QPSK | 2 | 4 |
| 16 QAM | 4 | 16 |
| 64 QAM | 6 | 64 |
| 256 QAM | 8 | 256 |
| 1024 QAM | 10 | 1024 |
| 4096 QAM | 12 | 4096 |

In the first application example, when 64QAM is used, $N_{Int}=3$ is obtained according to formula (1).

In the second application example, when 64QAM is used, $N_{Int}=3$ is also obtained according to formula (1).

Step 120: determining the number of bits U of a single code as the following formula.

$$U = \frac{ChipRate}{SF} \cdot TTI \cdot BitPerSymbol \quad (2)$$

where ChipRate is a chip rate of a WCDMA frequency division duplex (FDD) system (which is now fixedly 3.84 Mcps, wherein Mcps represents mega chip per second), SF is a spread spectrum factor of high speed downlink package access (which is now fixed to 16), and TTI is a transmission time interval of the high speed downlink package access (which is now fixedly 3 time slots, i.e., 2 ms). In addition, the meaning of BitPerSymbol is the same as that of formula (1).

In the first and second application example, U=2880 can be obtained according to the formula (2).

step 130: first determining whether it is QPSK data, and executing step 140 if yes, otherwise, executing step 150;

step 140: for the QPSK data, writing orderly U bits into $N_{Int}$ $N_{row} \times N_{col}$ rectangular interleavers and turning to step 180;

step 150: determining whether it is 16QAM data, and executing step 160 if yes, otherwise, executing step 170;

step 160: for the 16QAM data, writing orderly U bits into the $N_{Int}$ $N_{row} \times N_{col}$ rectangular interleavers and going to step 180, wherein the $(k+(m-1)\cdot 2)^{th}$ bit and the $(k+1+(m-1)\cdot 2)^{th}$ bit are written into the $m^{th}$ interleaver; and step 170: for data for 64QAM or higher order modulation, writing orderly U bits into the $N_{Int}$ $N_{row} \times N_{col}$ rectangular interleavers in one of the following four ways.

The first way is to write the $(k+(m-1)\cdot 2)^{th}$ bit and the $(k+1+(m-1)\cdot 2)^{th}$ bit of the U bits into the $m^{th}$ interleaver.

The parameters used in the step 160 and 170 will be first explained as below:

the meaning of U is the same as that of formula (2); the meaning of $N_{Int}$ is the same as that of formula (1); for HSDPA, presently $N_{row} \times N_{col}$ is fixedly 32 rows by 30 columns (that is, using 32×30 interleaver); and the value of k is as follows:

$$k = 1 + (n-1) \cdot BitPerSymbol \quad (3)$$

where the meaning of BitPerSymbol is the same as that of formula (1), and n is a positive integer between 1 and $$\frac{N_{row} \times N_{col}}{2}, \text{ i.e., } n \in \left\{1, 2, 3, \ldots \frac{N_{row} \times N_{col}}{2}\right\} \quad (4)$$

m is a number for the interleaver and is a positive integer between 1 and $N_{Int}$, including 1 and $N_{Int}$, and the meaning of $N_{Int}$ is the same as that of formula (1).

Figure 6:
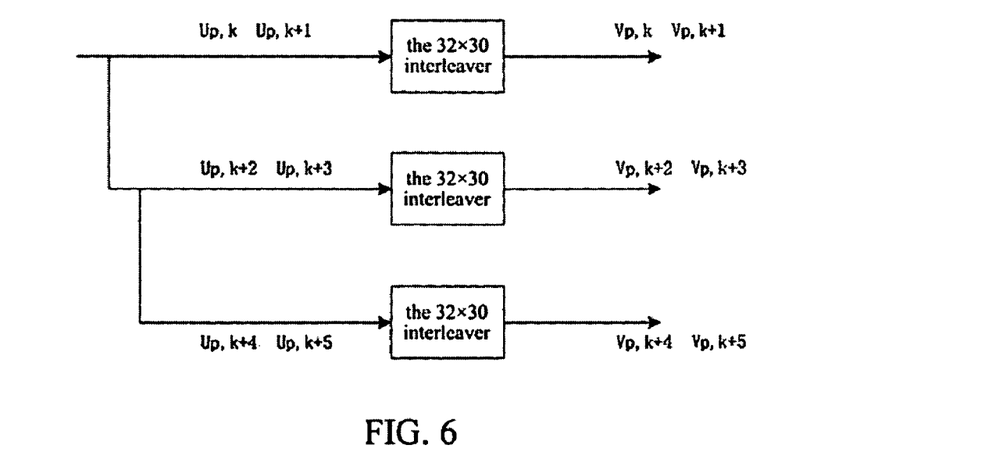
FIG. 6 is a schematic diagram of a method for implementing bit interleaving for 64QAM in accordance with the embodiment of the present invention.
Figure 7:
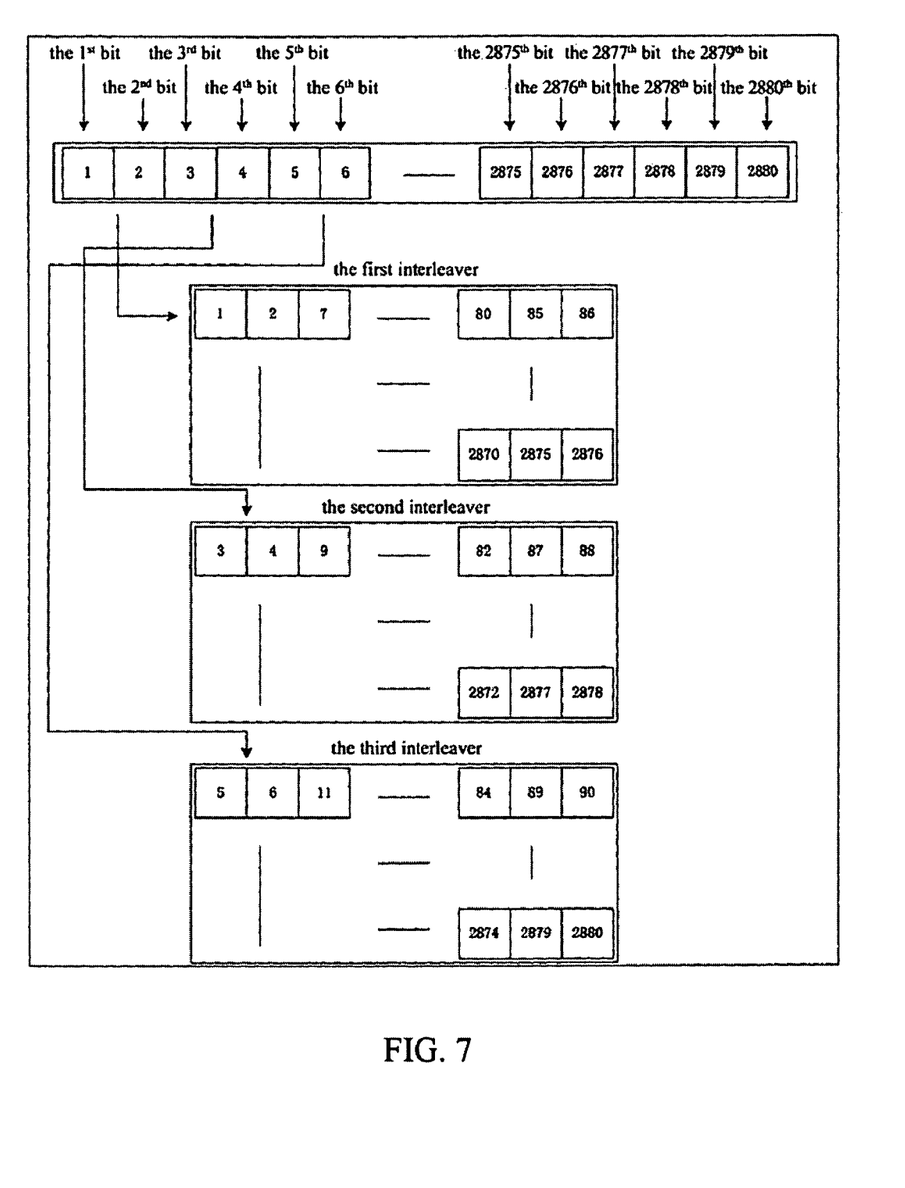
FIG. 7 is a schematic diagram for writing bits into 3 interleavers for 64QAM in accordance with the embodiment of the present invention.

In the first application example, if the first way is selected to be employed, then the $1^{st}$, $2^{nd}$, $7^{th}$, $8^{th}$, $13^{th}$, $14^{th}$, ..., $2863^{th}$, $2864^{th}$, $2869^{th}$, $2870^{th}$, $2875^{th}$, $2876^{th}$ bits of the 2880 bits are written orderly into the first interleaver, the $3^{rd}$, $4^{th}$, $9^{th}$, $10^{th}$, $15^{th}$, $16^{th}$, ..., $2865^{th}$, $2866^{th}$, $2871^{th}$, $2872^{th}$, $2877^{th}$, $2878^{th}$ bits of the 2880 bits are written orderly into the second interleaver, and the $5^{th}$, $6^{th}$, $11^{th}$, $12^{th}$, $17^{th}$, $18^{th}$, ..., $2867^{th}$, $2868^{th}$, $2873^{th}$, $2874^{th}$, $2879^{th}$, $2880^{th}$ bits of the 2880 bits are written orderly into the third interleaver, as shown in FIG. 6 and FIG. 7.

The second way is to write the $(k+(m-1)\cdot 2)^{th}$ bit and the $(k+1+(m-1)\cdot 2)^{th}$ bit of the U bits into the $(N_{Int}-m+1)^{th}$ interleaver.

The third way is to write the $(k+m-1)^{th}$ bit and the $(k+m-1+N_{Int})^{th}$ bit of the U bits into the $m^{th}$ interleaver.

The forth way is to write the $(k+m-1)^{th}$ bit and the $(k+m-1+N_{Int})^{th}$ bit of the U bits into the $(N_{Int}-m+1)^{th}$ interleaver.

In the various ways described above, when the bits are written into the interleavers, the bits are written column by column from the first column to the last column in each row in the interleavers and from the first row to the last row.

Figure 11:
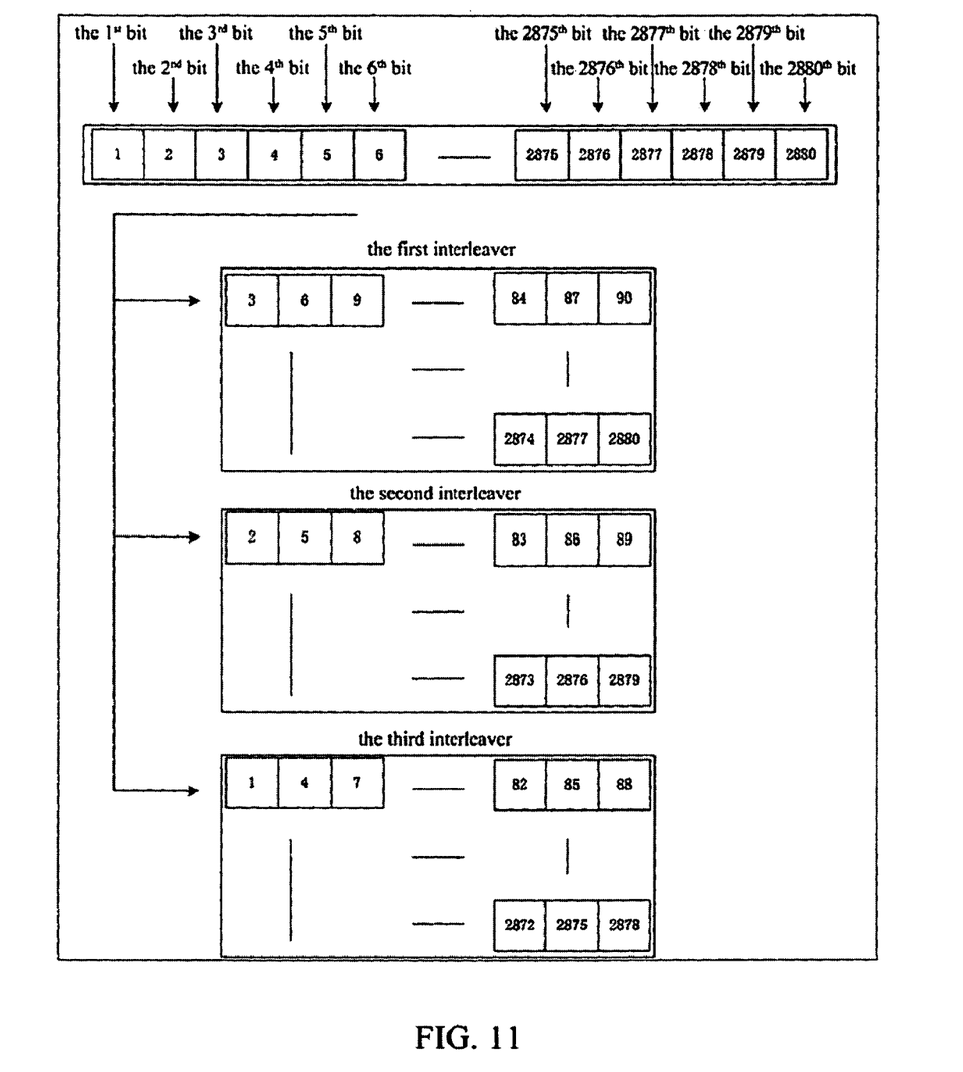
FIG. 11 is a schematic diagram for writing bits into 3 interleavers in another way for 64QAM in accordance with the embodiment of the present invention.

In the second application example, if the fourth way is selected to be employed, then the $3^{rd}$, $6^{th}$, $9^{th}$, $12^{th}$, $15^{th}$, $18^{th}$, ..., $2865^{th}$, $2868^{th}$, $2871^{th}$, $2874^{th}$, $2877^{th}$, $2880^{th}$ bits of the 2880 bits are written orderly into the first interleaver, the $2^{nd}$, $5^{th}$, $8^{th}$, $11^{th}$, $14^{th}$, $17^{th}$, ..., $2864^{th}$, $2867^{th}$, $2870^{th}$, $2873^{th}$, $2876^{th}$, $2879^{th}$ bits of the 2880 bits are written orderly into the second interleaver, and the $1^{st}$, $4^{th}$, $7^{th}$, $10^{th}$, $13^{th}$, $16^{th}$, ..., $2863^{th}$, $2866^{th}$, $2869^{th}$, $2872^{th}$, $2875^{th}$, $2878^{th}$ bits of the 2880 bits are written orderly into the third interleaver, as shown in FIG. 11 and FIG. 11.

step 180: bit interleaving the data in the $N_{Int}$ $N_{row} \times N_{col}$ interleavers in a manner of block interleaving.

Figure 8:
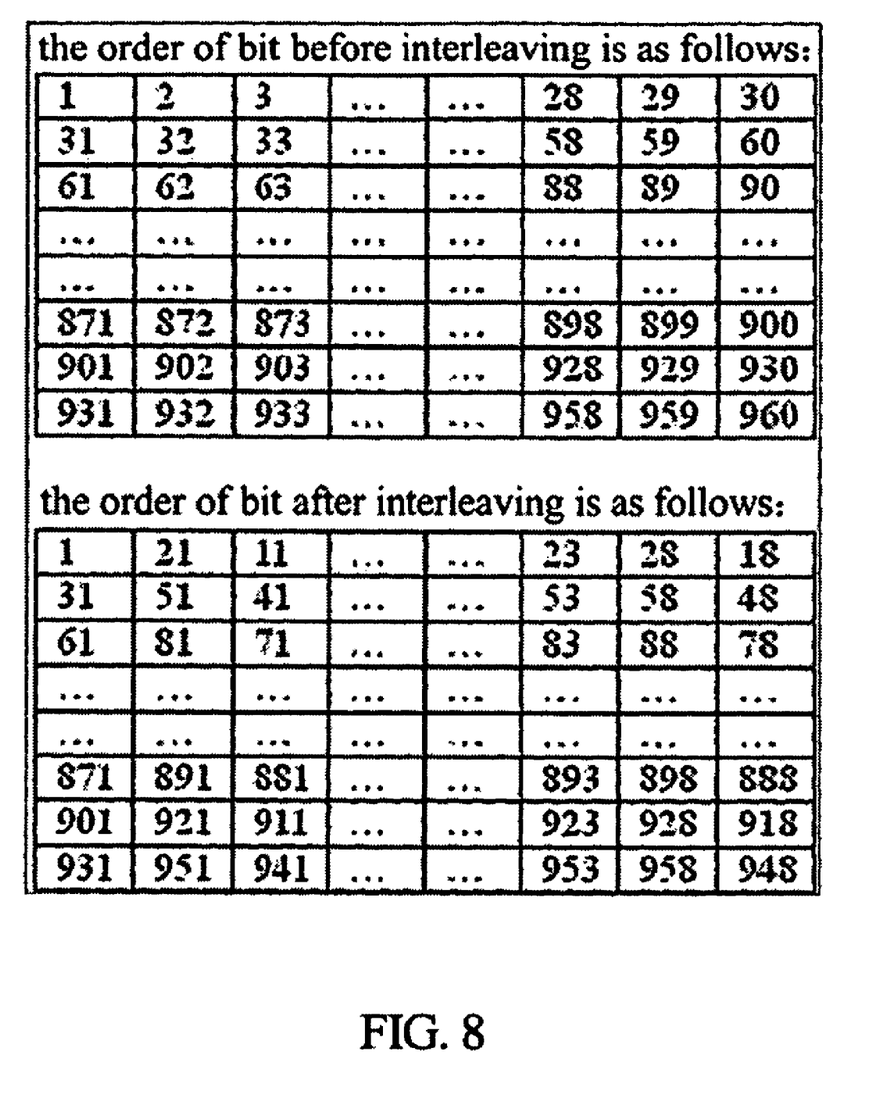
FIG. 8 is a schematic diagram of a method for implementing bit interleaving using the 32×30 interleaver.

In the first application example, bit interleaving the data in the 3 identical 32×30 interleavers in a manner of block interleaving, that is, provided that original column numbers are 1, 2, 3, 4, 5, ..., 28, 29, 30, then the interleaved column numbers are 1, 21, 11, 6, 16, 26, 4, 14, 24, 9, 19, 29, 2, 12, 22, 7, 17, 27, 5, 15, 25, 20, 10, 30, 13, 3, 8, 23, 28, 18, as shown in FIG. 8.

The method of interleaving employed in the second application example is the same.

step 190: reading bits of the single code in turn from the $N_{Int}$ interleavers, wherein the data in each interleaver is read by column.

Specifically, the data is read in multiple turns, wherein 2 bits are read from each interleaver orderly from the first interleaver to the $N_{Int}^{th}$ interleaver in each turn until all the data is read, and the data for each interleaver is read column by column from the first column to the last column and from the first row to the last row for each column.

In the first application example, when the bits of the single code are read from the 3 interleavers, 2 bits are read from the first interleaver orderly column by column from the first row and the first column, then 2 bits are read from the second interleaver, and then 2 bits are read from the third interleaver. The above described operations repeat for 480 times, as shown in FIG. 6 and FIG. 9.

In the second application example, when the bits of the single code are read from the 3 interleavers, 2 bits are read from the first interleaver orderly column by column from the first row and the first column, then 2 bits are read from the second interleaver, and then 2 bits are read from the third interleaver. The above described operations repeat for 480 times, as shown in FIG. 9 and FIG. 10.

step 200: combining orderly $2 \cdot N_{Int}$ bits read from the $N_{Int}$ interleavers in each turn into U bits.

Figure 9:
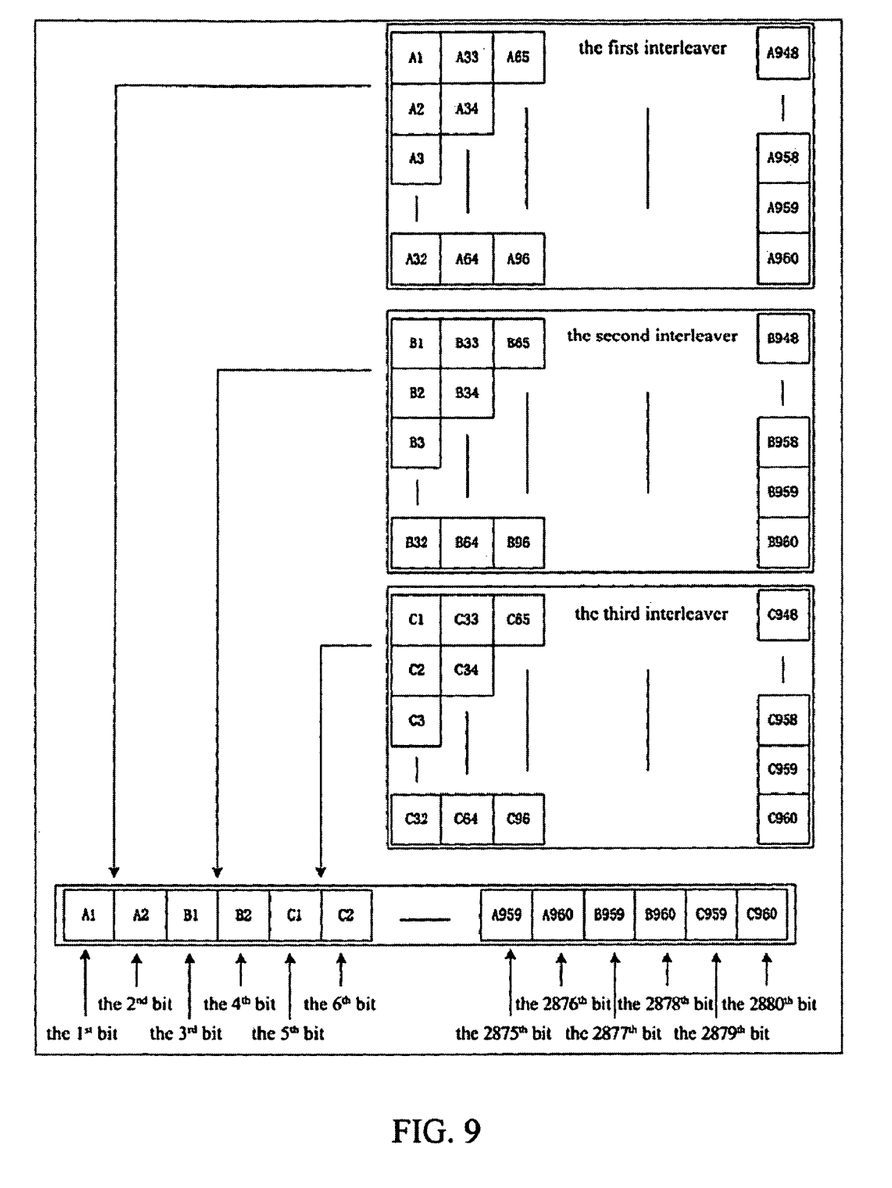
FIG. 9 is a schematic diagram for reading bits from 3 interleavers and constituting 2880 bits for 64QAM in accordance with the embodiment of the present invention.
Figure 10:
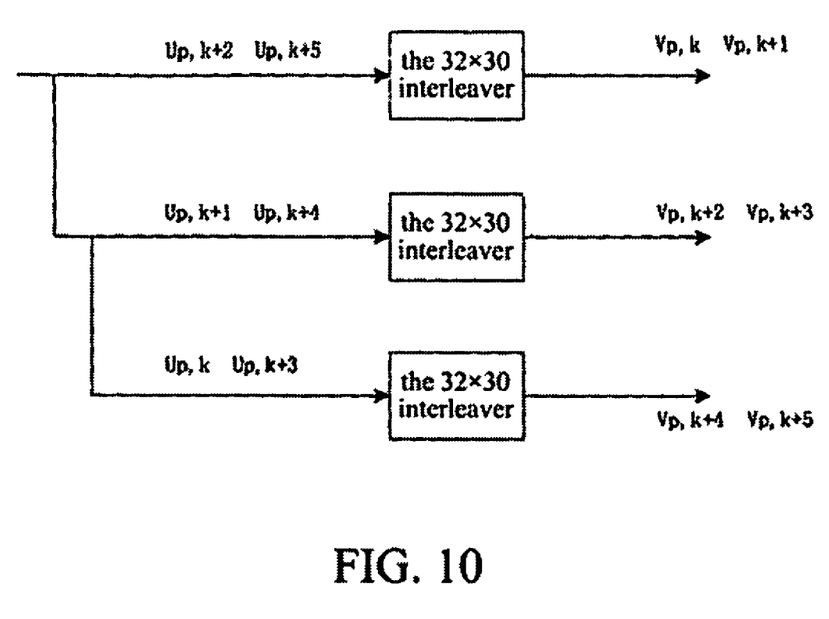
FIG. 10 is a schematic diagram for implementing bit interleaving in another way for 64QAM in accordance with the embodiment of the present invention.

In the first application example, every 6 bits read from 3 interleavers are combined orderly into 2880 bits, as shown in FIG. 9.

In the second application example, every 6 bits read from 3 interleavers are combined orderly into 2880 bits, as shown in FIG. 9.

FIG. 5 is a schematic diagram of a method for implementing bit interleaving for various modulation scheme in accordance with the embodiment of this invention. The method is applicable to 6 kinds of modulation scheme including QPSK, 16QAM, 64QAM, 256QAM, 1024QAM and 4096QAM. It can be seen from the figure that when QPSK modulation scheme is employed, only one interleaver needs to be used. When the modulation schemes are 16QAM, 64QAM, 256QAM, 1024QAM and 4096QAM, 2, 3, 4, 5 and 6 interleavers are used respectively. When data is written, it is processed in the first way in the step 170, and it certainly can be processed in several other ways.

A device used for implementing the method according to the embodiment is as shown in FIG. 3. The device comprises a module for reading information from the high layer, a module for calculating the number of interleavers, a module for calculating the number of bits in a code, a module for reading data, a module for assigning bits, a module for writing bits for interleaving, a module for interleaving bits, a module for reading interleaved bits, a module for combining bits, and wherein The module for calculating the number of interleavers is used for calculating the number $N_{Int}$ of rectangular interleavers required by a single code according to the modulation scheme and outputting the number $N_{Int}$ to those modules which need the number $N_{Int}$.

The module for calculating the number of bits in a code is used for calculating the bits number U of a single code according to system parameters and outputting the bits number U to those modules which need the bits number U.

The module for reading data is used for reading data after physical channel segmentation and outputting the data to the module for assigning bits.

The module for assigning bits is used for assigning the inputted U bits into the $N_{Int} N_{row} \times N_{col}$ interleavers according to the modulation scheme.

The module for writing bits for interleaving is used for writing respectively in row the data obtained from the module for reading data into the corresponding interleavers.

The module for interleaving bits is used for interleaving the bits written into the interleavers in a manner of block interleaving.

The module for reading interleaved bits is used for reading the bits of a single code in turn from $N_{Int} N_{row} \times N_{col}$ rectangular interleavers, wherein the data in each interleaver are read in column and, The module for combining bits is used for combining orderly the data read from the $N_{Int}$ interleavers into the U bits.

The modules described above complete the processing for one code at a time. Specific calculating method or operation method of each module has been described in detail in the above process and unnecessary details will not be given herein any more.

After employing the device and method described above, a Node B can provide high system performance on the basis of being fully compatible with the existing system.

The operation principle of the present invention is described in detail hereinabove, but it is only a visualized example for the purpose of easy comprehension and should not be regarded as a limitation to the scope of the present invention. In addition, various possible and equivalent variations and replacements can be made according to the technology scheme of the present invention and the description of its preferred embodiments. All these modifications and alternatives should fall into the protection scope the appended claims.

INDUSTRIAL APPLICABILITY

The high speed packet access evolution system can support well higher order modulation technology such as 64 quadrature amplitude modulation and be fully compatible with the existing system using the method and device of bit interleaving according to the present invention such that the high speed packet access evolution system can obtain higher system throughput than the high speed downlink packet access system and upgrade the existing system, thereby providing high system performance on the basis of being fully compatible with the existing system. The method and device is applicable for bit interleaving in a wideband code division multiple access mobile communication system, and more particularly for bit interleaving of a high speed downlink share channel in the high speed packet access evolution.

What is claimed is as the followings:

1. A method for bit interleaving, used for bit interleaving of the High Speed Downlink Share CHannel in the High Speed Packet Access Evolution of the Wideband Code Division Multiple Access mobile communication system, wherein the method comprises firstly reading high layer control information containing the modulation scheme and the number of codes, and a procedure of bit interleaving for each code comprises the following steps:

(a) Determining the number of rectangular interleavers $N_{Int}$ required to be used according to the modulation scheme;

(b) Determining the number of bits U of a single code according to system parameters;

(c) Writing respectively in row of U bit data into $N_{Int}$ $N_{row} \times N_{col}$ interleavers after the physical channel segment;

(d) Interleaving the data in the $N_{Int} N_{row} \times N_{col}$ interleavers in a manner of block interleaving;

(e) Reading bits of the single code in turn from the $N_{Int}$ interleavers, wherein the data in each interleaver is read by column; and (f) Combining the data orderly which are read from the $N_{Int}$ interleavers in each turn into U bits.

2. The method according to claim 1, wherein in the step (a), the number of the rectangular interleavers is $$N_{Int} = \frac{BitPerSymbol}{2} = \frac{1}{2} \cdot \log_2(ModulationOrder),$$

where BitPerSymbol is the number of bits in each symbol, and ModulationOrder is an order of modulation, and when the modulation scheme is Quadrature Phase Shift Keying modulation, the order of modulation is 4; when the modulation scheme is 16 Quadrature Amplitude Modulation, the order of modulation is 16; when the modulation scheme is 64 Quadrature Amplitude Modulation, the order of modulation is 64; when the modulation scheme is 256 Quadrature Amplitude Modulation, the order of modulation is 256; when the modulation scheme is 1024 Quadrature Amplitude Modulation, the order of modulation is 1024; and when the modulation scheme is 4096 Quadrature Amplitude Modulation, the order of modulation is 4096 and, wherein when the modulation scheme is 64 Quadrature Amplitude Modulation, the number $N_{Int}$ is 3; when the modulation scheme is 256 Quadrature Amplitude Modulation, the number $N_{Int}$ is 4; when the modulation scheme is 1024 Quadrature Amplitude Modulation, the number $N_{Int}$ is 5; and when the modulation scheme is 4096 Quadrature Amplitude Modulation, the number $N_{Int}$ is 6.

3. The method according to claim 1, wherein in the step (b), the number of bits of the single code is $$U = \frac{ChipRate}{SF} \cdot TTI \cdot BitPerSymbol,$$

where ChipRate is the chip rate of the Wideband Code Division Multiple Access Frequency Division Duplex system, SF is the Spread Factor of the High Speed Downlink Package Access, and TTI is the Transmission Time Interval of the HighSpeed Downlink Package Access and, wherein when the modulation scheme is 64 Quadrature Amplitude Modulation, U is 2880; when the modulation scheme is 256 Quadrature Amplitude Modulation, U is 3840; when the modulation scheme is 1024 Quadrature Amplitude Modulation, U is 4800; and when the modulation scheme is 4096 Quadrature Amplitude Modulation, U is 5760.

4. The method according to claim 1, wherein in the step (c), writing orderly the U bits into $N_{Int}$ $N_{row} \times N_{col}$ rectangular interleavers in one of the following four ways if the modulation scheme is 64 Quadrature Amplitude Modulation, or 256 Quadrature Amplitude Modulation, or 1024 Quadrature Amplitude Modulation or 4096 Quadrature Amplitude Modulation:

1) Writing the $(k+(m-1)\cdot 2)^{th}$ bit and the $(k+1+(m-1)\cdot 2)^{th}$ bit of the U bits into the $m^{th}$ interleaver;
2) Writing the $(k+(m-1)\cdot 2)^{th}$ bit and the $(k+1+(m-1)\cdot 2)^{th}$ bit of the U bits into the $(N_{Int}-m+1)^{th}$ interleaver;
3) Writing the $(k+m-1)^{th}$ bit and the $(k+m-1+N_{Int})^{th}$ bit of the U bits into the $m^{th}$ interleaver and;
4) Writing the $(k+m-1)^{th}$ bit and the $(k+m-1+N_{Int})^{th}$ bit of the U bits into the $(N_{Int}-m+1)^{th}$ interleaver;

where the value of k is as follows: $k=1+(n-1)\cdot BitPerSymbol$, $N_{row} \times N_{col}$ is a row number or a column number of the interleavers specified in the High Speed Downlink Packer Access, n is a positive integer between 1 and $$\frac{N_{row} \times N_{col}}{2}, \text{ i.e., } n \in \left\{1, 2, 3, \ldots \frac{N_{row} \times N_{col}}{2}\right\},$$

and m is the number for the interleaver and is a positive integer between 1 and $N_{Int}$, including 1 and $N_{Int}$ and, wherein in various cases described above, for each interleaver, the bits are written column by column from the first column to the last column in each row and from the first row to the last row.

5. The method according to claim 1, wherein in the step (e), reading the bits of the single code from the $N_{Int}$ interleavers is performed in multiple turns, and 2 bits are read from each interleaver orderly from the first interleaver to the $N_{Int}$-th interleaver in each turn until all the bits are read, and the bits for each interleaver are read row by row from the first row to the last row in each column and from the first column to the last column and, wherein in the step (f), combining orderly $2 \cdot N_{Int}$ bits read in each turn into the U bits.

6. A device for bit interleaving, used for bit interleaving of the High Speed Downlink Share CHannel in the High Speed Packet Access Evolution of the Wideband Code Division Multiple Access mobile communication system, wherein the device comprises a module for reading information from the high layer, a module for calculating the number of interleavers, a module for calculating the number of bits in a code, a module for reading data, a module for assigning bits, a module for writing bits for interleaving, a module for interleaving bits, a module for reading interleaved bits, a module for combining bits and, wherein the module for reading information from the high layer is used for reading control information containing the modulation scheme and the code number from the high layer and outputting the control information to a module which uses the modulation scheme and the code number, wherein the modulation scheme comprises one of 64 Quadrature Amplitude Modulation, or 256 Quadrature Amplitude Modulation, or 1024 Quadrature Amplitude Modulation or 4096 Quadrature Amplitude Modulation;

The module for calculating the number of interleavers is used for calculating the number $N_{Int}$ of rectangular interleavers required by a single code according to the modulation scheme and outputting the number $N_{Int}$ to those modules which need the number $N_{Int}$;

The module for calculating the number of bits in a code is used for calculating the bits number U of a single code according to system parameters and outputting the bits number U to those modules which need the bits number U;

The module for reading data is used for reading data after physical channel segmentation and outputting the data to the module for assigning bits;

The module for assigning bits is used for assigning the inputted U bits into the $N_{Int}$ $N_{row} \times N_{col}$ interleavers according to the modulation scheme;

The module for writing bits for interleaving is used for writing respectively in row the data obtained from the module for reading data into the corresponding interleavers;

The module for interleaving bits is used for interleaving the bits written into the interleavers in a manner of block interleaving;

The module for reading interleaved bits is used for reading the bits of a single code in turn from $N_{Int}$ $N_{row} \times N_{col}$ rectangular interleavers, wherein the data in each interleaver are read in column;

The module for combining bits is used for combining orderly the data read from the $N_{Int}$ interleavers into the U bits;

Wherein the modules described above complete the processing for one code at a time.

7. A device according to claim 6, wherein the module for calculating the number of interleavers calculates the number $N_{Int}$ of the rectangular interleavers in the following manner:

$$N_{Int} = \frac{BitPerSymbol}{2} = \frac{1}{2} \cdot \log_2(ModulationOrder),$$

where BitPerSymbol is the number of bits in each symbol, the ModulationOrder is the order of modulation, and when the modulation scheme is 64 Quadrature Amplitude Modulation, the order of modulation is 64, when the modulation scheme is 256 Quadrature Amplitude Modulation, the order of modulation is 256, when the modulation scheme is 1024 Quadrature Amplitude Modulation, the order of modulation is 1024, when the modulation scheme is 4096 Quadrature Amplitude Modulation, the order of modulation is 4096.

8. A device according to claim 6, wherein the module for calculating the number of bit in a code calculates the number of bits U of the single code in the following manner:

$$U = \frac{ChipRate}{SF} \cdot TTI \cdot BitPerSymbol$$

where ChipRate is a chip rate of the Wideband Code Division Multiple Access Frequency Division Duplex system, SF is the Spread Factor of the High Speed Downlink Package Access, and TTI is the Transmission Time Interval of the High Speed Downlink Package Access.

9. A device according to claim 6, wherein the module for assigning bits accomplish assignment and the module for writing bits for interleaving writing the bits in the following manners:

Writing orderly the U bits into $N_{Int}$ $N_{row} \times N_{col}$ rectangular interleavers in one of the following four ways if the modulation scheme is 64 Quadrature Amplitude Modulation, or 256 Quadrature Amplitude Modulation, or 1024 Quadrature Amplitude Modulation or 4096 Quadrature Amplitude Modulation:

1) Writing the $(k+(m-1)\cdot2)^{th}$ bit and the $(k+1+(m-1)\cdot2)^{th}$ bit of the U bits into the $m^{th}$ interleaver;
2) Writing the $(k+(m-1)\cdot2)^{th}$ bit and the $(k+1+(m-1)\cdot2)^{th}$ bit of the U bits into the $(N_{Int}-m+1)^{th}$ interleaver;
3) Writing the $(k+m-1)^{th}$ bit and the $(k+m-1+N_{Int})^{th}$ bit of the U bits into the $m^{th}$ interleaver and;
4) Writing the $(k+m-1)^{th}$ bit and the $(k+m-1+N_{Int})^{th}$ bit of the U bits into the $(N_{Int}-m+1)^{th}$ interleaver;

where a value of k is as follows: $k=1+(n-1)\cdot BitPerSymbol$, $N_{row} \times N_{col}$ is a row number or a column number of the interleavers specified in the High Speed Downlink Packer Access, n is a positive integer between 1 and $\frac{N_{row} \times N_{col}}{2}$, i.e., $n \in \{1, 2, 3, \ldots \frac{N_{row} \times N_{col}}{2}\}$, and m is the number of interleavers which is a positive integer between 1 and $N_{Int}$, including 1 and $N_{Int}$, and, Wherein in various cases described above, for each interleaver, the bits are written column by column from the first column to the last column in each row and from the first row to the last row.

10. A device according to claim 6, wherein the module for reading interleaved bits reads bits of a single code from $N_{Int}$ interleavers in multiple turns, 2 bits are read from each interleaver orderly from the first interleaver to the $N_{Int}^{th}$ interleaver in each turn until all the bits are read, and the bits of each interleaver are read row by row from the first row to the last row in each column and from the first column to the last column and, Wherein the module for combining bits combines orderly $2 \cdot N_{Int}$ bits read in each turn into the U bits.

11. A method for bit interleaving for 64 Quadrature Amplitude Modulation, the method is used for bit interleaving of the High Speed Downlink Share CHannel in the High Speed Packet Access Evolution of the Wideband Code Division Multiple Access mobile communication system, wherein the method comprises firstly reading high layer control information containing a modulation scheme and the number of codes and a procedure of bit interleaving for each code is as follows:

(a) Determining the number of rectangular interleavers required to be used as 3 for 64 Quadrature Amplitude Modulation;

(b) Determining the number of bits in a code as 2880 according to system parameters;

(c) After physical channel segmentation, writing respectively 2880 by row bits into 3 identical 32×30 interleavers according to 64 Quadrature Amplitude Modulation, wherein the bits are written according to the following manner:

Writing the $(k+(m-1)\cdot2)^{th}$ bit and the $(k+1+(m-1)\cdot2)^{th}$ bit of the 2880 bits into the $m^{th}$ interleaver, where a value for m is 1, 2 or 3 as the following;

When m is 1, for the first interleaver, the bits written are the $k^{th}$ bit and the $(k+1)^{th}$ bit;

When m is 2, for the second interleaver, the bits written are the $(k+2)^{th}$ bit and the $(k+3)^{th}$ bit and;

When m is 3, for the third interleaver, the bits written are the $(k+4)^{th}$ bit and the $(k+5)^{th}$ bit;

(d) The bits are interleaved in three identical 32×30 interleavers in the manner of block interleaving;

(e) Reading the bits of a code from three identical interleavers in multiple turns, wherein 2 bits are read from each interleaver orderly from the first interleaver, then from the second interleaver and still then from the third interleaver in each turn until all the bits are read, the bits for each interleaver are read row by row from the first row to the last row in each column and from the first column to the last column and, (f) Combining orderly the bits read from the three identical interleavers in each turn into the 2880 bits.

* * * * *